United States Patent
Takahashi et al.

(10) Patent No.: US 10,090,218 B2
(45) Date of Patent: Oct. 2, 2018

(54) PLACEMENT BASE FOR SEMICONDUCTOR DEVICE AND VEHICLE EQUIPMENT

(71) Applicant: SHINDENGEN ELECTRIC MANUFACTURING CO., LTD., Tokyo (JP)

(72) Inventors: Toyohide Takahashi, Hanno (JP); Takuji Yamashiro, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 15/545,131

(22) PCT Filed: Jan. 6, 2016

(86) PCT No.: PCT/JP2016/050257
§ 371 (c)(1),
(2) Date: Jul. 20, 2017

(87) PCT Pub. No.: WO2017/119082
PCT Pub. Date: Jul. 13, 2017

(65) Prior Publication Data
US 2018/0005911 A1   Jan. 4, 2018

(51) Int. Cl.
*H01L 23/13* (2006.01)
*H01L 23/373* (2006.01)
(52) U.S. Cl.
CPC ............ *H01L 23/13* (2013.01); *H01L 23/373* (2013.01)
(58) Field of Classification Search
CPC ..... H01L 23/13; H01L 23/373; H01L 23/498; H01L 23/49822; H01L 23/49827
See application file for complete search history.

(56) References Cited

U.S. PATENT DOCUMENTS

| | | | | |
|---|---|---|---|---|
| 5,497,031 A * | 3/1996 | Kozono | ................. | H01L 23/13 257/693 |
| 6,163,065 A * | 12/2000 | Seshan | ................. | H01L 23/585 257/508 |
| 6,261,492 B1 * | 7/2001 | Iovdalsky | ............... | H01L 23/13 156/293 |
| 6,396,708 B1 | 5/2002 | Iguchi et al. | | |

(Continued)

FOREIGN PATENT DOCUMENTS

JP     2003297990 A    10/2003
JP     2005101259 A    4/2005

(Continued)

OTHER PUBLICATIONS

International Search Report for PCT/JP2016/050257 dated Mar. 15, 2016 and its English translation provided by WIPO.

(Continued)

*Primary Examiner* — Nathan W Ha
(74) *Attorney, Agent, or Firm* — Ladas & Parry, LLP

(57) ABSTRACT

A placement base (100) of a semiconductor device (90) comprises a body (10), to which a radiation agent (80) having viscosity is applied and on which a semiconductor device (90) is disposed, and a protrusion (20), which is placed in an outer periphery of the body (10) and on which the semiconductor device (90) is not disposed. A detective groove (30) for introducing the radiation agent (80) is provided on a surface of the protrusion (20).

7 Claims, 10 Drawing Sheets

(56) References Cited

U.S. PATENT DOCUMENTS

| | | | |
|---|---|---|---|
| 8,982,577 B1* | 3/2015 | Fuentes | H01L 23/13 257/787 |
| 2007/0085595 A1* | 4/2007 | Taki | H01L 27/092 327/534 |
| 2007/0096297 A1 | 5/2007 | Frey | |
| 2008/0174005 A1 | 7/2008 | Kubota et al. | |
| 2008/0237852 A1* | 10/2008 | Yoshida | H01L 29/41741 257/737 |
| 2008/0315239 A1 | 12/2008 | Lin et al. | |
| 2009/0200648 A1 | 8/2009 | Graves, Jr. | |
| 2009/0218663 A1* | 9/2009 | Bauer | H01L 23/49503 257/666 |
| 2010/0108512 A1* | 5/2010 | Hattori | G01N 27/44791 204/452 |
| 2013/0020692 A1* | 1/2013 | Fujisawa | H01L 23/3107 257/676 |
| 2014/0030827 A1* | 1/2014 | Cadotte | H01L 22/12 438/14 |
| 2014/0217521 A1* | 8/2014 | Johari-Galle | B81C 1/00134 257/415 |
| 2016/0133776 A1* | 5/2016 | Kishi | H01L 21/463 257/428 |
| 2016/0172359 A1* | 6/2016 | Yoon | H01L 27/0886 257/401 |
| 2018/0012821 A1 | 1/2018 | Takahashi et al. | |

FOREIGN PATENT DOCUMENTS

| | | |
|---|---|---|
| JP | 2009246063 A | 10/2009 |
| JP | 2010010505 A | 1/2010 |
| JP | 2013138113 A | 7/2013 |

OTHER PUBLICATIONS

Written Opinion for PCT/JP2016/050257 dated Mar. 15, 2016, and its English translation provided by Google Translate.

International Search Report for PCT/JP2016/050259 dated Mar. 22, 2016 and its English translation provided by WIPO.

Written Opinion for PCT/JP2016/050259 dated Mar. 22, 2016, 2016 and its English translation provided by Google Translate.

U.S. Appl. No. 15/545,083, filed Jul. 20, 2017, Takahashi et al.

From U.S. Appl. No. 15/545,083 (now U.S. Publication No. 2018-0012821 A1), Non-Final Office Action dated Mar. 8, 2018.

* cited by examiner

PLACEMENT BASE FOR SEMICONDUCTOR DEVICE AND VEHICLE EQUIPMENT

CROSS-REFERENCE TO RELATED APPLICATION

This application is the U.S. national phase of PCT Application PCT/JP2016/050257 filed on Jan. 6, 2016, the disclosure of which is incorporated herein by reference in its entirety.

TECHNICAL FIELD

The present invention relates to a placement base for a semiconductor device and a vehicle equipment.

BACKGROUND ART

In the related art, it is known that a semiconductor device covered with a resin mold is to be placed in a metallic case having a radiation unit such as a fin (for example, see JP 2010-10505 A). In such an aspect, it is known that providing a radiation sheet between the semiconductor device and a placement base disposed in the case enhances radiatability, but not at a satisfactory level.

SUMMARY OF INVENTION

Technical Problem

An object of the present invention is to provide a placement base for a semiconductor device and a vehicle equipment capable of achieving high radiatability.

Solution to Problem

A placement base of a semiconductor device according to the present invention comprises:
a body, to which a radiation agent having viscosity is applied and on which the semiconductor device is disposed; and
a protrusion, which is placed in an outer periphery of the body and on which the semiconductor device is not disposed,
wherein a detective groove for introducing the radiation agent is provided on a surface of the protrusion.

In the placement base of the semiconductor device according to the present invention,
a surface of the body may be provided with a body-side groove in such a manner that a central part of the body is intermittently or continuously surrounded by the body-side groove, and
the body-side groove and the detective groove may be communicated with each other.

In the placement base of the semiconductor device according to the present invention,
the body may have a substantially quadrilateral shape, when seen from above,
two protrusions may be provided to opposing sides of the body, and
each protrusion may be provided with the detective groove.

In the placement base of the semiconductor device according to the present invention,
the body may have a substantially quadrilateral shape, when seen from above,
three protrusions may be provided to three sides of the body, and
each protrusion may be provided with the detective groove.

In the placement base of the semiconductor device according to the present invention,
the body may have a substantially rectangular shape, when seen from above,
two protrusions may be provided to opposing short sides respectively and
one protrusion may be provided to a long side.

In the placement base of the semiconductor device according to the present invention,
the protrusion provided to the long side may protrude toward an outer periphery of case, on which the placement base is placed.

The placement base of the semiconductor device, according to the present invention, may further comprise a fixing unit for fixing the semiconductor device, and
wherein the body may have a supporting unit being configured to support at least a part of a periphery of the semiconductor device, and a bottom surface placed in an inner periphery of the supporting unit and placed lower than the supporting unit,
wherein the fixing unit may be provided to the supporting unit, and
wherein a body-side groove communicated with the detective grooves may be provided between the fixing unit and the bottom surface.

A vehicle equipment according to the present invention comprises:
a semiconductor device;
a placement base having a body on which the semiconductor device is disposed, and a protrusion which is placed in an outer periphery of the body and on which the semiconductor device is not disposed; and
a radiation agent having viscosity, and the radiation agent being applied to the body of the placement base and being provided between the semiconductor device and the placement base,
wherein a detective groove for introducing the radiation agent is provided on a surface of the protrusion.

Advantageous Effects of Invention

According to the present invention, using the radiation agent having viscosity, it is possible not only to achieve high radiatability but also to check spreading conditions of the radiation agent by the detective groove so that it is possible to reliably spread the radiation agent. Therefore, the radiation agent can be reliably applied between the semiconductor device and placement base. Thus, it is possible to enhance thermal conductivity between the semiconductor device and placement base and to achieve high radiatability.

BRIEF DESCRIPTION OF DRAWINGS

FIG. 8 is a cross sectional view in which FIG. 7 is divided along a straight line VIII-VIII illustrated in FIG. 7.

DESCRIPTION OF EMBODIMENTS

Embodiment

<<Configuration>>

Figure 1:
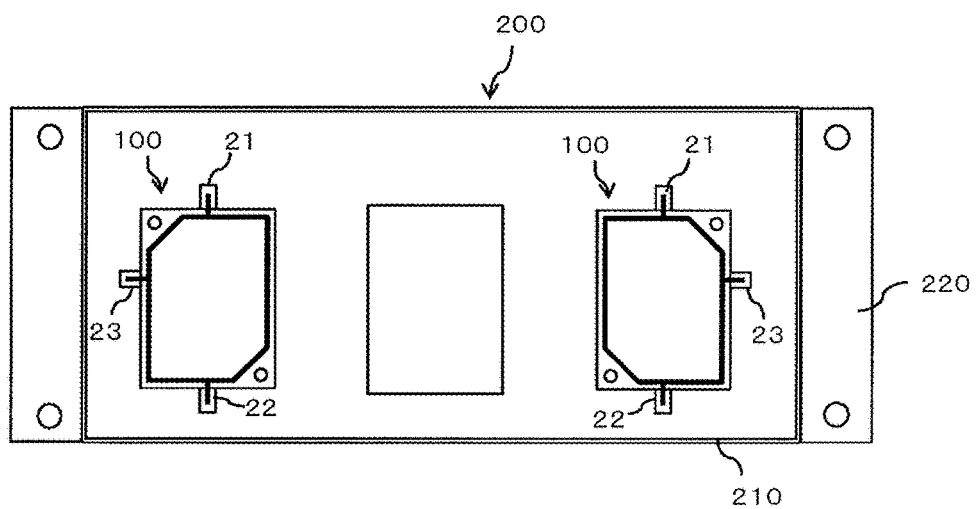
FIG. 1 is a top plane view of vehicle equipment according to an embodiment of the present invention.

A placement base for a semiconductor device according to the present embodiment is disposed in vehicle equipment such as power-supply equipment used in automobiles. As illustrated in FIG. 1, the power-supply equipment includes a case 200 having, for example, a metallic seating 220 for placing switching power-supply equipment and the like, and a metallic cover 210 combined with the seating 220 so as to electromagnetically shield the switching power-supply equipment. FIG. 1 illustrates an inside of the cover 210, but the inside of the cover 210 is actually covered with the cover 210 so that it cannot be seen from an outside. As illustrated in FIG. 1, a placement base 100 is disposed in the case 200.

Figure 2:
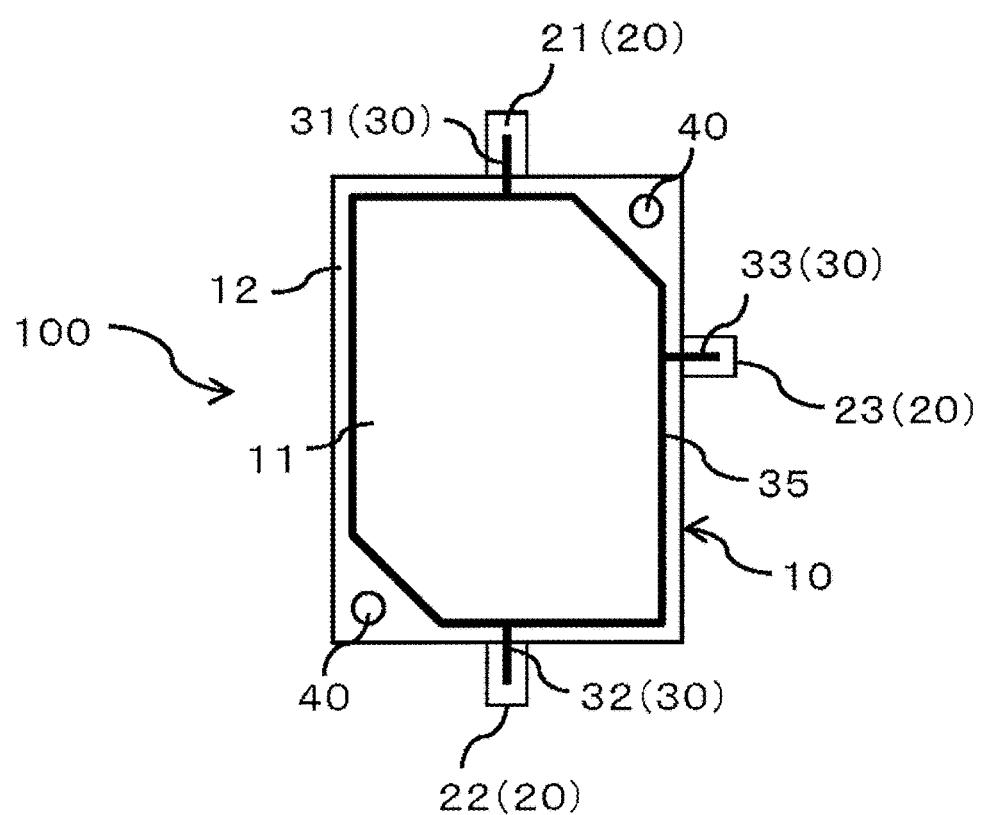
FIG. 2 is a top plane view of a placement base for a semiconductor device according to the embodiment of the present invention.
Figure 8:
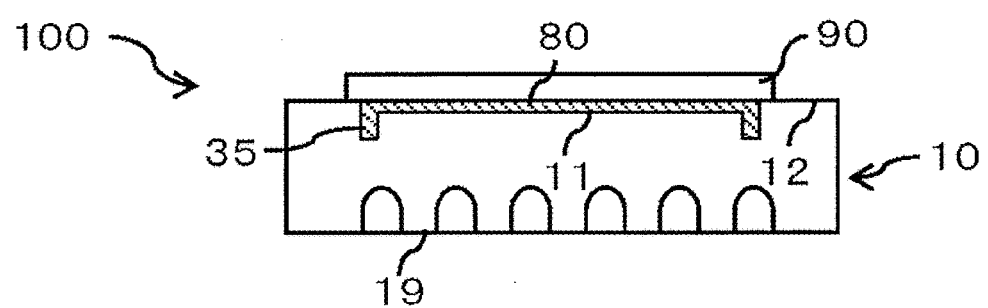

A radiation agent 80 such as radiation grease having viscosity is applied to the placement base 100 for a semiconductor device 90 such as an IC chip (see FIG. 8). As illustrated in FIG. 2, the placement base 100 has a body 10, and protrusions 20 placed in an outer periphery of the body 10. The body 10 is where the semiconductor device 90 is disposed, while the protrusions 20 are where the semiconductor device 90 is not disposed. A detective groove 30 for introducing the radiation agent 80 may be provided to each protrusion 20 and to a surface of the body 10 corresponding to an inner periphery of each protrusion 20. To enhance radiatability, the placement base 100 may be formed of a metallic material.

Figure 3:
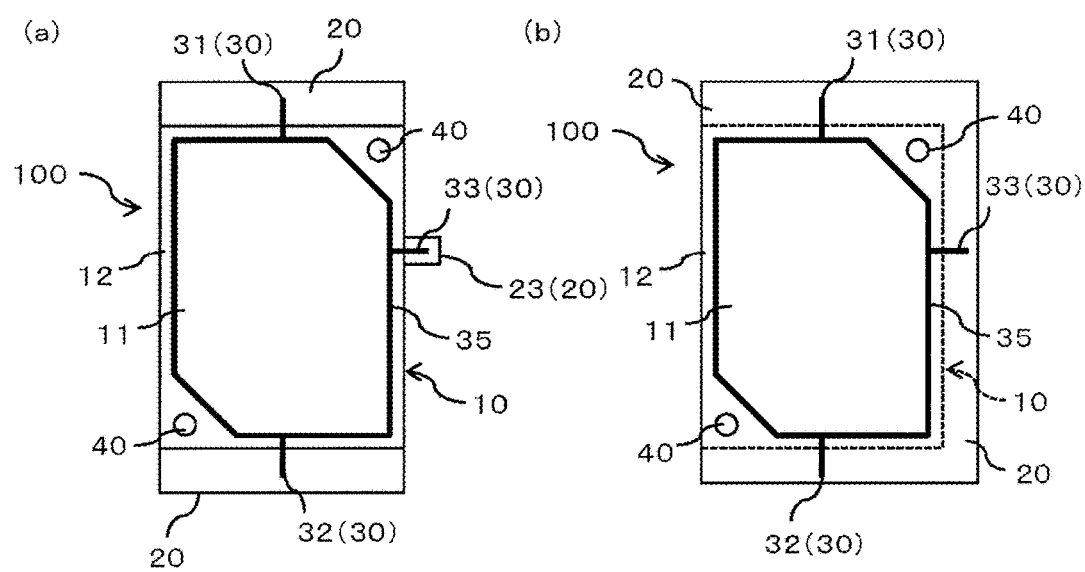
FIG. 3(a) is a top plane view of a placement base for a semiconductor device according to a first modification of the embodiment of the present invention.
FIG. 3(b) is a top plane view of a placement base for a semiconductor device according to a second modification of the embodiment of the present invention.

In the present embodiment, each "protrusion 20" should not be specifically restricted as long as it is placed in the outer periphery of the body 10, where the semiconductor device 90 is not to be disposed. In FIG. 3(a), those parts stretching farther than the body 10 in a vertical direction in the paper are also protrusions 20. In FIG. 3(b), those parts stretching farther than the body 10 in the vertical direction, in the right direction, and in directions obliquely to the upper right and obliquely to the lower right are also the protrusions 20. In FIG. 3(b), a "dotted line" region represents that the semiconductor device 90 is to be disposed within the region. Noted that there is no such boundary in actuality.

Figure 4:
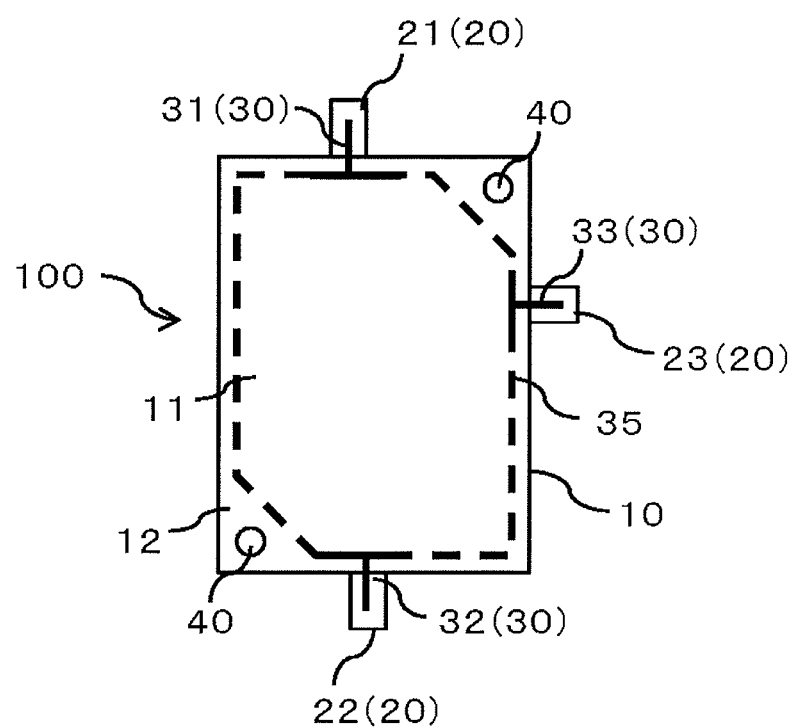
FIG. 4 is a top plane view of a placement base for a semiconductor device according to a third modification of the embodiment of the present invention.

As illustrated in FIG. 2, the surface of the body 10 may be provided with a body-side groove 35 in such a manner that a central part of the body 10 is continuously surrounded by the body-side groove 35. As illustrated in FIG. 4, the surface of the body 10 may be provided with the body-side groove 35 in such a manner that the central part of the body 10 is intermittently surrounded by the body-side groove 35. Furthermore, the body-side groove 35 and the detective grooves 30 may be communicated with each other.

The body 10 herein may have a substantially quadrilateral shape, when seen from above. Herein, the term "above" refers to the normal direction side of a placement surface on which the semiconductor device 90 is placed, unless otherwise restricted (for example, as long as there is no indication such as "upper and lower parts of the paper"). Note that the term "upper and lower parts of the paper" literally represents "upper and lower" sides of the paper taken along the vertical line. In regard to the term "substantially quadrilateral shape" herein, satisfactory is a shape with two pairs of sides opposing each other. For example, an aspect of a shape with rounded corners is also included in the term.

As illustrated in FIG. 2, three protrusions 20 may be provided to three sides of the body 10, and each protrusion 20 may be provided with the detective groove 30. In an aspect illustrated in FIG. 2, the three protrusions 20 include a first protrusion 21, a second protrusion 22, and a third protrusion 23. A first detective groove 31, a second detective groove 32, and a third detective groove 33 may be provided, respectively corresponding to the first protrusion 21, the second protrusion 22 and the third protrusion 23.

Figure 5:
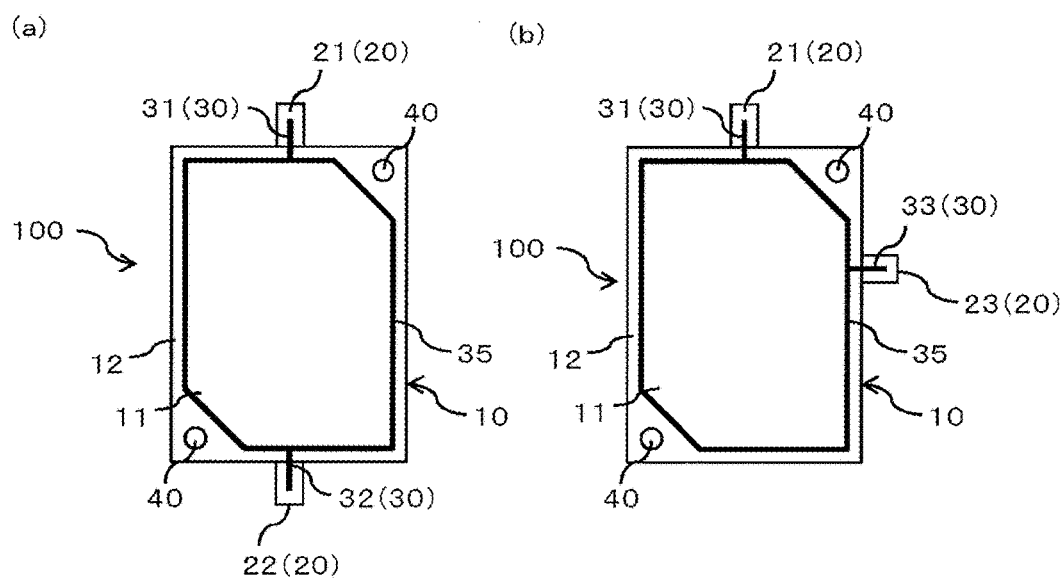
FIG. 5(a) is a top plane view of a placement base for a semiconductor device according to a fourth modification of the embodiment of the present invention.
FIG. 5(b) is a top plane view of a placement base for a semiconductor device according to a fifth modification of the embodiment of the present invention.

As illustrated in FIG. 5, two protrusions 20 may be provided and each protrusion 20 may be provided with the detective groove 30. The two protrusions 20 may be provided to opposing sides of the body 10 as illustrated in 5(a). Alternatively, the two protrusions 20 may be provided to adjacent sides of the body 10 as illustrated in FIG. 5(b). The two opposing protrusions 20 may be provided to similar positions in a width direction of the protrusions 20 (a horizontal direction in the paper in an aspect illustrated in FIG. 5(a)). Alternatively, the two opposing protrusions 20 may be provided to different positions in the width direction of the protrusions 20.

Figure 6:
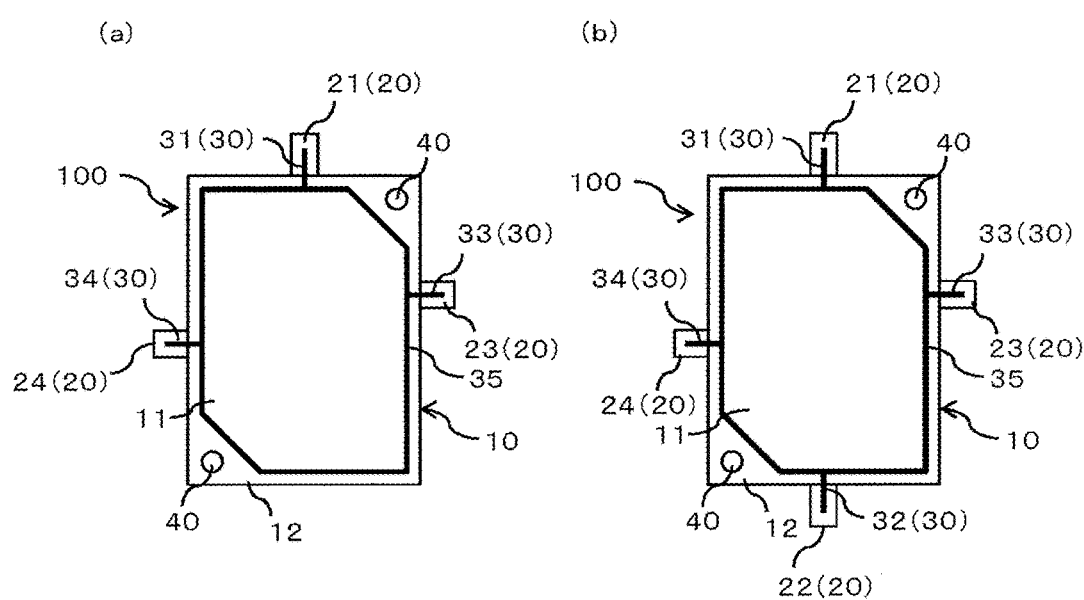
FIG. 6(a) is a top plane view of a placement base for a semiconductor device according to a sixth modification of the embodiment of the present invention.
FIG. 6(b) is a top plane view of a placement base for a semiconductor device according to a seventh modification of the embodiment of the present invention.

In an aspect illustrated in FIG. 6(b), in regard to sides (short-sides) opposing each other in the upper and lower parts of the paper, a first protrusion 21 and a second protrusion 22 are provided to similar positions in the width direction of the first protrusion 21 and the second protrusion 22 (the horizontal direction in the paper). Furthermore, in regard to sides (long-sides) opposing each other in the right and left parts of the paper, a third protrusion 23 and a fourth protrusion 24 (to be mentioned later) are provided to different positions in the width direction of the third protrusion 23 and the fourth protrusion 24 (the vertical direction in the paper). In regard to the sides opposing each other in such manners, the protrusions 20 may be provided to similar positions or different positions in the width direction. In a case where the opposing two protrusions 20 are provided to different positions in the width direction of the protrusions 20, such an aspect may also be applicable that the protrusions 20 are point-symmetric with respect to the center of the body 10 (see the third protrusion 23 and the fourth protrusion 24 in FIG. 6(b)). In a case of employing such an aspect, it is favorable in that it is possible to check application conditions of the radiation agent 80 at point-symmetric positions and to ensure whether the radiation agent 80 spreads evenly.

As illustrated in FIG. 2, in a case where the body 10 seen from above has a substantially rectangular shape, two protrusions 20 may be provided to the opposing short sides respectively and one protrusion 20 may be provided to the long side. As illustrated in FIG. 6(a), two protrusions 20 may be provided to each of the opposing long sides and one protrusion 20 may be provided to the short side. As illustrated in FIG. 6(b), four protrusions 20 may be provided to four sides of the body 10 and each protrusion 20 may be provided with the detective groove 30. In regard to the term "substantially rectangular shape" herein, satisfactory is a shape with two pairs of opposing sides including short sides and long sides. For example, an aspect of a shape with rounded corners is also included in the term. It should be noted that the short sides may not necessarily have the same length, and one of a pair of short sides may be longer than the other. Furthermore, the long sides may not necessarily have the same length, and one of a pair of long sides may be longer than the other. However, note that the longer side of the short sides is to be shorter than the shorter side of the long sides.

As illustrated in FIG. 1, in a case where the body 10 seen from above has a substantially rectangular shape, the protrusion (the third protrusion 23 in FIG. 1) provided to the long side may protrude toward the outer periphery of the case 200. In other words, as illustrated in FIG. 1, in regard to the placement base 100 illustrated on the left, the third protrusion 23 provided to the long side may protrude toward the left of the paper, and in regard to the placement base 100 illustrated on the right, the third protrusion 23 provided to the long side may protrude toward the right of the paper.

Figure 7:
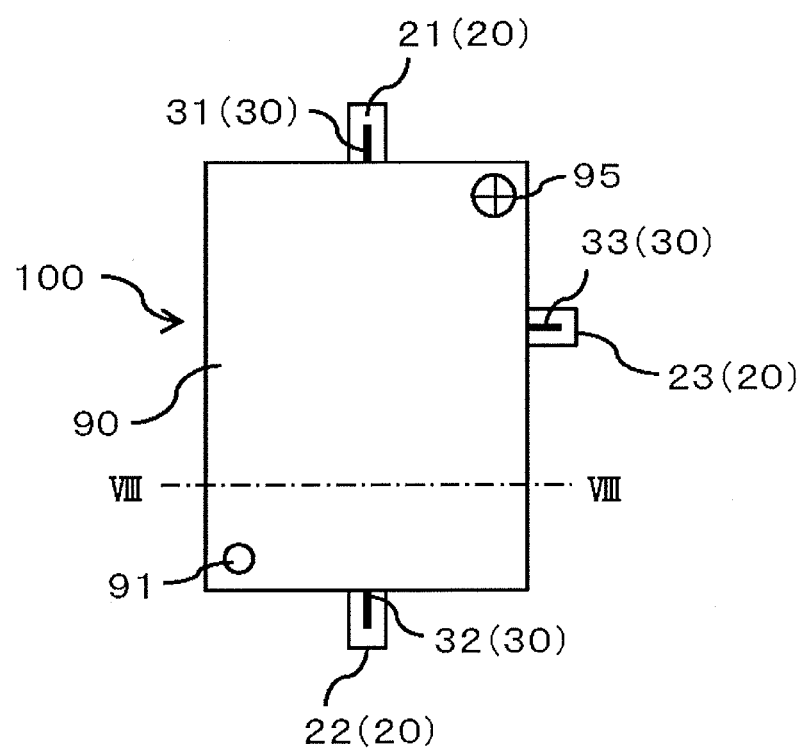
FIG. 7 is a top plane view illustrating an aspect in which a semiconductor device is placed on the placement base according to the embodiment of the present invention.

As illustrated in FIG. 2, the placement base 100 may further include a fixing unit 40 for fixing the semiconductor device 90. The fixing unit 40 may be, for example, a fixing hole 40 such as a screw hole used for inserting and fixing a fastener member 95 (see FIG. 7) such as a screw configured to fasten the semiconductor device 90. At least two fixing holes 40 may be provided. The two fixing holes 40 may be provided diagonally as illustrated in FIG. 2. In such an aspect, as illustrated in FIG. 7, the semiconductor device 90 may have a through-hole 91 into which the fastener member 95 is inserted.

As illustrated in FIG. 8, the body 10 may have a supporting unit 12 and a bottom surface 11. The supporting unit 12 is configured to support at least a part of the periphery of the semiconductor device 90. The bottom surface 11 is placed in the inner periphery of the supporting unit 12 and is placed lower than the supporting unit 12. As illustrated in FIG. 2, the fixing unit 40 may be provided to the supporting unit 12. The body-side groove 35 communicated with the detective grooves 30 may be provided between the fixing unit 40 and the bottom surface 11.

In a case where the semiconductor device 90 has a substantially quadrilateral shape, the supporting unit 12 may be configured to support at least two opposing sides of the semiconductor device 90. Furthermore, the supporting unit 12 may be configured to support four sides of the semiconductor device 90. Herein described is an aspect in which the supporting unit 12 supports the four sides of the semiconductor device 90.

The supporting unit 12 may be configured to support the semiconductor device 90 only at the periphery. The supporting unit 12 for supporting the semiconductor device 90 may not be provided to the inner side of the body-side groove 35. Furthermore, the bottom surface 11 and the body-side groove 35 may be provided adjacently (consecutively) (see FIG. 8).

Figure 9:
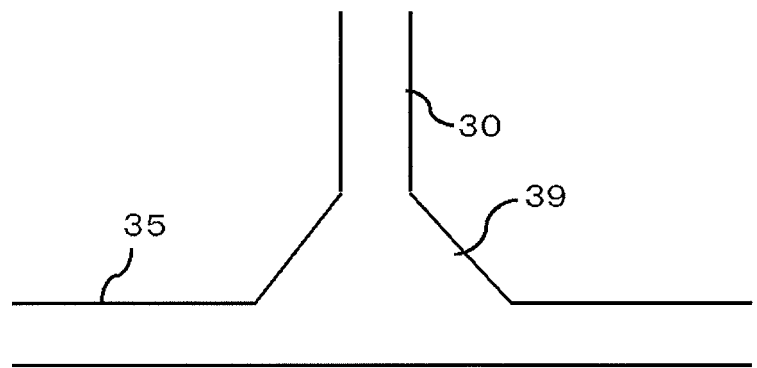
FIG. 9 is a top plane view enlarging a joint between a body-side groove and a detective groove according to the embodiment of the present invention.
Figure 10:
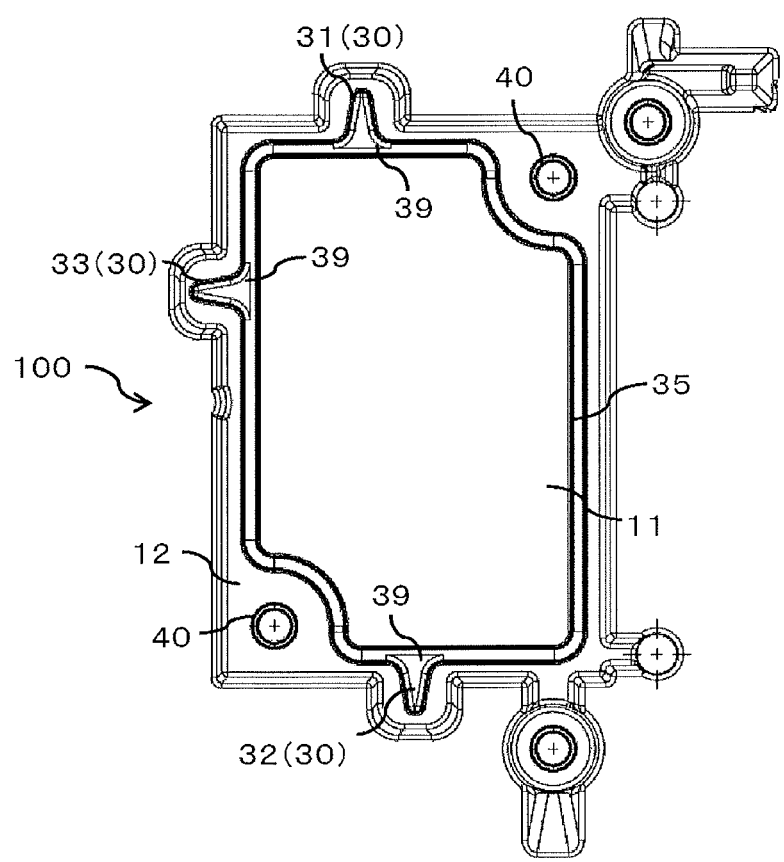
FIG. 10 is a top plane view of a placement base for a semiconductor device according to an eighth modification of the embodiment of the present invention.

As illustrated in FIG. 8, a fin 19 may be provided to a back surface of the body 10. According to such an aspect, it is possible to enhance the radiatability. As illustrated in FIGS. 9 and 10, in each joint between the detective grooves 30 and the body-side groove 35, an end of each detective groove 30 closer to the body-side groove 35 may have a wide width. In an aspect illustrated in FIGS. 9 and 10, the end of each detective groove 30 closer to the body-side groove 35 has a tapered part 39. By employing such an aspect, it is possible to efficiently conduct to the detective grooves 30 the radiation agent 80 introduced from the body-side groove 35 so as to use the radiation agent 80 for detection.

<<Effects>>

Next, effects, which are not described yet, achieved by the present embodiment with the above-described configuration will be described.

According to the present embodiment, using the radiation agent 80 having viscosity, it is possible not only to achieve high radiatability but also to check spreading conditions of the radiation agent 80 by the detective groove 30 so that it is possible to reliably spread the radiation agent 80. Therefore, the radiation agent can be reliably applied between the semiconductor device 90 and the placement base 100. Thus, it is possible to enhance thermal conductivity between the semiconductor device 90 and the placement base 100 and to achieve high radiatability.

Herein, in a case of employing an aspect in which the surface of the body 10 is provided with the body-side groove 35 in such a manner that the central part of the body 10 is continuously surrounded by the body-side groove 35 as illustrated in FIGS. 2, 3, 5 and 6, or in a case of employing an aspect in which the surface of the body 10 is provided with the body-side groove 35 in such a manner that the central part of the body 10 is intermittently surrounded by the body-side groove 35 as illustrated in FIG. 4, it is possible to prevent the radiation agent 80 from leaking to the outside. According to the aspect in which the body-side groove 35 is provided continuously as illustrated in FIGS. 2, 3, 5, and 6, it is excellent in that the radiation agent 80 can be prevented more reliably from leaking to the outside.

In a case of employing an aspect in which the body-side groove 35 is communicated with the detective grooves 30 as illustrated in FIGS. 2 to 6, it is possible to conduct to the detective grooves 30 the radiation agent 80 introduced from the body-side groove 35 so as to use the radiation agent 80 for detection. Therefore, it is possible to check the spreading conditions of the radiation agent 80 more efficiently.

In a case of employing an aspect in which the body 10 has a substantially quadrilateral shape and where two protrusions 20 are provided to opposing sides and each protrusion 20 is provided with the detective groove 30 (see FIG. 5(a)), it is possible to check the spreading conditions of the radiation agent 80 between the opposing sides.

In a case of employing an aspect in which the body 10 has a substantially quadrilateral shape and where three protrusions 20 are provided to three sides of the body 10 and each protrusion 20 is provided with the detective groove 30 (see FIGS. 2 and 6(a)), it is possible to check the spreading conditions of the radiation agent 80 in three directions. Furthermore, according to the aspect in which the protrusions 20 protrude in three directions, it is favorable in that a space in a side provided with no protrusion 20 can be utilized effectively. According to an aspect illustrated in FIG. 1, the third protrusion 23 protrudes toward the outside and sides facing inward (in FIG. 1, a side on the right in regard to the placement base 100 on the left, and a side on the left in regard to the placement base 100 on the right) is provided with no protrusion 20 so that it is favorable in that an area inside the placement base 100 (a central area in the width direction in FIG. 1) can be utilized effectively.

As illustrated in FIGS. 2 to 6, in a case of employing an aspect in which the body 10 has a substantially rectangular shape and two protrusions 20 are provided to each of the opposing short sides and one protrusion 20 is provided to a long side, it is possible to check the spreading conditions of the radiation agent 80 in the longitudinal direction. It is generally necessary that the radiation agent 80 spread widely in the longitudinal direction so that it is favorable to be able to check the spread of the radiation agent 80 from both directions of the longitudinal direction.

As illustrated in FIG. 1, there is a high possibility that other members are to be provided to the inner periphery of the seating 220. Therefore, in a case where the body 10 has a substantially rectangular shape, the protrusion (the third protrusion 23 in FIG. 1) provided to the long side may protrude toward the outer periphery of the case 200. By employing such an aspect, it is favorable in that it is possible to check the spreading conditions of the radiation agent 80 in the longitudinal direction and to secure a space for placing other members.

As illustrated in FIGS. 2 to 6, in a case of employing an aspect in which two fixing holes 40 are provided diagonally, it is excellent in that the semiconductor device 90 can be fixed with respect to the placement base 100 in a well-balanced manner. By fixing the semiconductor device 90 on the placement base 100 in such a well-balanced manner, it is possible to make differences in height between the supporting unit 12 and the bottom surface 11 more uniformly in the entire surface direction. Thus, the radiation agent 80 can be made to have a more uniform thickness so that it is possible to conduct heat generated by the semiconductor device 90 to the placement base 100 more efficiently.

As illustrated in FIGS. 2 to 6, in a case of employing an aspect in which the body-side groove 35 is provided between the fixing unit 40 and the bottom surface 11, it is favorable in that the fixing unit 40 including the fixing hole 40 and the like can be prevent from being filled with the radiation agent 80.

Lastly, descriptions on the aforementioned respective embodiments and variations as well as disclosed drawings are merely examples for describing the invention described in CLAIMS. The descriptions on the aforementioned embodiments or disclosed drawings should not be construed to limit the invention described in CLAIMS.

REFERENCE SIGNS LIST

10 Body
11 Bottom surface
12 Supporting unit
20 Protrusion
30 Detective groove
35 Body-side groove
40 Fixing unit
80 Radiation agent
90 Semiconductor device
100 Placement base
200 Case

What is claimed is:

1. A placement base of a semiconductor device comprising:
   a body, to which a radiation agent having viscosity is applied and on which the semiconductor device is disposed; and
   a protrusion, which is placed in an outer periphery of the body and on which the semiconductor device is not disposed,
   wherein a detective groove for introducing the radiation agent is provided on a surface of the protrusion,
   wherein a surface of the body is provided with a body-side groove in such a manner that a central part of the body is intermittently or continuously surrounded by the body-side groove, and
   wherein a part of the body-side groove and a part of the detective groove is communicated with each other, and the part of the body-side groove and the part of the detective groove are not parallel with each other.

2. The placement base of the semiconductor device according to claim 1,
   wherein the body has a substantially quadrilateral shape, when seen from above,
   wherein two protrusions are provided to opposing sides of the body, and
   wherein each protrusion is provided with the detective groove.

3. A vehicle equipment comprising:
   a semiconductor device;
   the placement base according to claim 1;
   a radiation agent having viscosity, and the radiation agent being applied to the body of the placement base and being provided between the semiconductor device and the placement base.

4. A placement base of a semiconductor device comprising:
   a body, to which a radiation agent having viscosity is applied and on which the semiconductor device is disposed; and
   a protrusion, which is placed in an outer periphery of the body and on which the semiconductor device is not disposed,
   wherein a detective groove for introducing the radiation agent is provided on a surface of the protrusion,
   wherein the body has a substantially quadrilateral shape, when seen from above,
   wherein three protrusions are provided to three sides of the body, and
   wherein each protrusion is provided with the detective groove, and
   wherein at least one detective groove is not parallel to another detective groove.

5. The placement base of the semiconductor device according to claim 4,
   wherein the body has a substantially rectangular shape, when seen from above,
   wherein two protrusions are provided to opposing short sides respectively and
   wherein one protrusion is provided to a long side.

6. The placement base of the semiconductor device according to claim 5,
   wherein the protrusion provided to the long side protrudes toward an outer periphery of case, on which the placement base is placed.

7. A placement base of a semiconductor device comprising:
- a body, to which a radiation agent having viscosity is applied and on which the semiconductor device is disposed;
- a protrusion, which is placed in an outer periphery of the body and on which the semiconductor device is not disposed; and
- a fixing unit for fixing the semiconductor device, and
- wherein a detective groove for introducing the radiation agent is provided on a surface of the protrusion,
- wherein the body has a supporting unit being configured to support at least a part of a periphery of the semiconductor device, and a bottom surface placed in an inner periphery of the supporting unit and placed lower than the supporting unit,
- wherein the fixing unit is provided to the supporting unit, and
- wherein a body-side groove communicated with the detective grooves is provided between the fixing unit and the bottom surface, and
- wherein a part of the body-side groove, which communicates with a part of the detective groove, is not parallel to the part of the detective groove.

* * * * *